(12) United States Patent
Yang et al.

(10) Patent No.: US 10,504,913 B2
(45) Date of Patent: Dec. 10, 2019

(54) METHOD FOR MANUFACTURING EMBEDDED NON-VOLATILE MEMORY

(71) Applicant: TAIWAN SEMICONDUCTOR MANUFACTURING CO., LTD., Hsinchu (TW)

(72) Inventors: Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/378,140

(22) Filed: Dec. 14, 2016

(65) Prior Publication Data
US 2018/0151753 A1    May 31, 2018

Related U.S. Application Data

(60) Provisional application No. 62/426,661, filed on Nov. 28, 2016.

(51) Int. Cl.
*H01L 27/11573* (2017.01)
*H01L 27/11568* (2017.01)
*H01L 29/423* (2006.01)

(52) U.S. Cl.
CPC .. *H01L 27/11573* (2013.01); *H01L 27/11568* (2013.01); *H01L 29/42344* (2013.01)

(58) Field of Classification Search
CPC ............. H01L 29/792; H01L 29/66833; H01L 21/28282; H01L 27/11563; H01L 29/42328; H01L 29/42344; H01L 29/518; H01L 29/42324; H01L 29/4234; H01L 29/7883
See application file for complete search history.

(56) References Cited

U.S. PATENT DOCUMENTS

| | | | | |
|---|---|---|---|---|
| 7,259,422 B1 * | 8/2007 | Hisamoto | ......... | H01L 21/28282 257/316 |
| 7,453,118 B2 * | 11/2008 | Tomiie | .............. | H01L 21/28282 257/314 |
| 8,722,496 B1 * | 5/2014 | Roizin | .............. | H01L 21/28282 438/142 |
| 8,730,726 B2 * | 5/2014 | Lu | ....................... | G11C 16/0483 257/314 |
| 2005/0077566 A1 * | 4/2005 | Zheng | ............... | H01L 29/42336 257/315 |

(Continued)

*Primary Examiner* — Khiem D Nguyen
(74) *Attorney, Agent, or Firm* — McClure, Qualey & Rodack, LLP

(57) ABSTRACT

A semiconductor device includes a substrate, a trap storage structure, a control gate, a cap structure, a word line well, a source line, spacers, a gap oxide layer, a word line and a gate oxide layer. The trap storage structure includes a first oxide layer, a nitride layer and a second oxide layer stacked on the substrate. The control gate is directly on the trap storage structure. The cap structure is stacked on the control gate to form a stacked structure. The word line well and the source line are disposed in the substrate at opposite sides of the stacked structure. The spacers are on sidewalls of the stacked structure. The gap oxide layer is on a sidewall of one spacer. The word line is on the word line well and the gap oxide layer. The gate oxide layer is between the word line and the word line well.

20 Claims, 13 Drawing Sheets

(56) References Cited

U.S. PATENT DOCUMENTS

| | | | |
|---|---|---|---|
| 2009/0050956 A1* | 2/2009 | Ishimaru | H01L 27/115 257/324 |
| 2010/0261327 A1* | 10/2010 | Arigane | G11C 16/3418 438/294 |
| 2010/0320524 A1* | 12/2010 | Shukuri | B82Y 10/00 257/316 |
| 2012/0058618 A1* | 3/2012 | Hayashi | H01L 21/28282 438/287 |
| 2012/0074486 A1* | 3/2012 | Lue | G11C 16/0483 257/324 |
| 2012/0074537 A1* | 3/2012 | Jung | H01L 21/02326 257/637 |
| 2013/0234226 A1* | 9/2013 | Shen | H01L 27/11521 257/319 |
| 2016/0087056 A1* | 3/2016 | Wu | H01L 29/42328 257/320 |
| 2016/0163722 A1* | 6/2016 | Chang | H01L 27/11521 257/316 |
| 2018/0138317 A1* | 5/2018 | Lin | H01L 29/66833 |

* cited by examiner

METHOD FOR MANUFACTURING EMBEDDED NON-VOLATILE MEMORY

RELATED APPLICATIONS

This application claims priority to U.S. Provisional Application Ser. No. 62/426,661, filed Nov. 28, 2016, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of 1.5 T memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
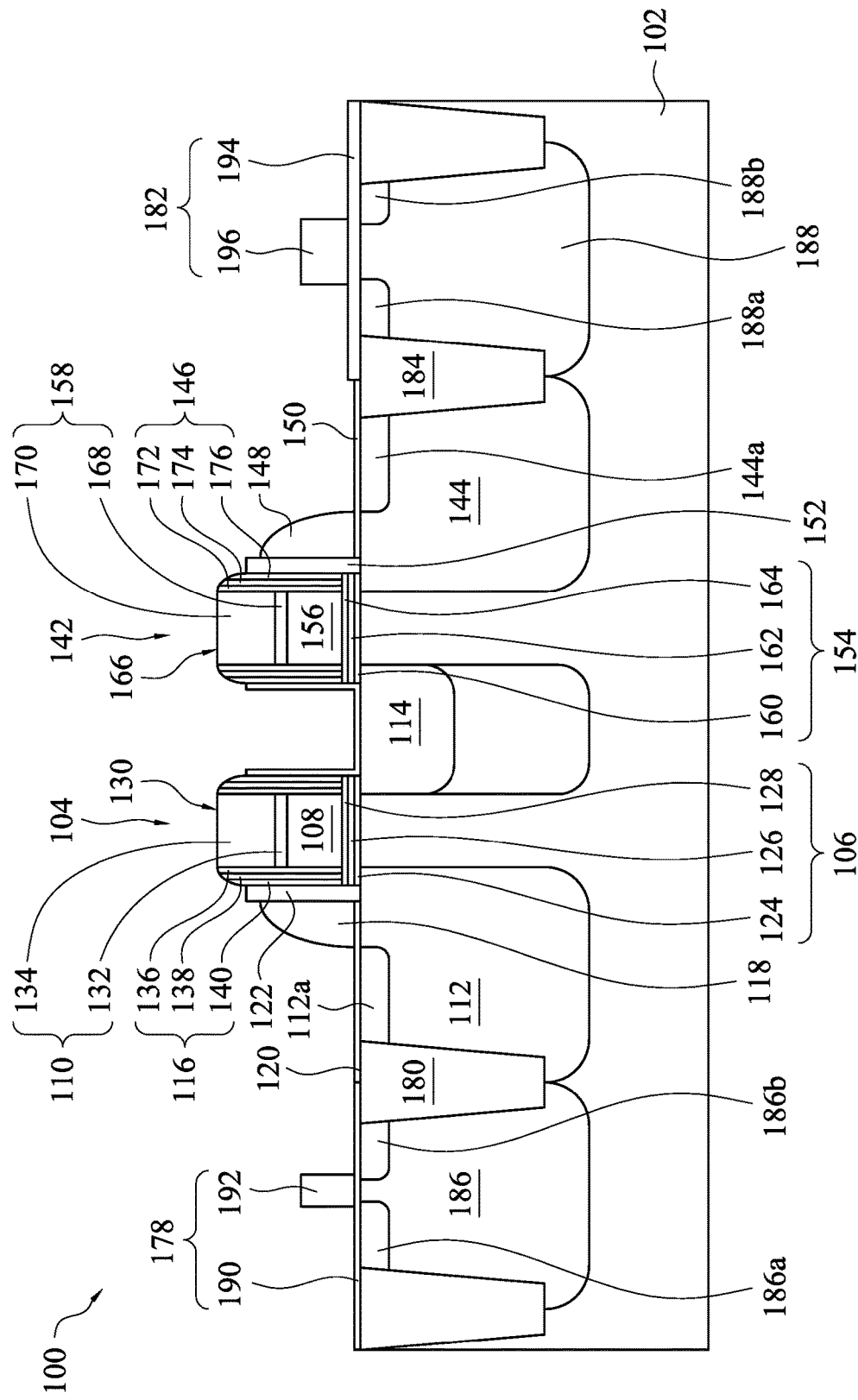
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a gate structure of a typical 1.5 T memory, a floating gate is used as a trap storage for charge trapping. The floating gate is formed from polysilicon. For the electrical requirement, the floating gate formed from polysilicon is required to have a sufficient thickness. Furthermore, the gate structure further includes an isolation structure between the floating gate and a control gate over the floating gate to separate the floating gate and the control gate. Thus, the gate structure has a higher stack topology, and thus subsequent patterning processes of the memory are difficult, resulting in a complex process integration and high process cost.

Embodiments of the present disclosure are directed to providing a semiconductor device and a method for manufacturing the semiconductor device, in which an oxide/nitride/oxide (ONO) structure is used as a trap storage structure of a gate structure of the semiconductor device, and the ONO trap storage structure is thinner than the polysilicon floating gate, such that the thickness of the gate structure is reduced. In addition, the control gate can be directly disposed on the ONO trap storage structure, and the gate structure does not need any isolation structure to separate a control gate from the ONO trap storage structure, such that the thickness of the gate structure is further reduced. Thus, compared to the gate structure of the conventional memory, the gate structure has a lower structure topology which is close to that of a logic gate, such that the subsequent patterning processes of the semiconductor device are relatively easy, thereby simplifying a process for manufacturing the semiconductor device and integration of the processes of the semiconductor device and other device, and decreasing process time and reducing process cost.

FIG. 1 is a schematic cross-sectional view of a semiconductor device in accordance with various embodiments. A semiconductor device 100 may be a 1.5 T memory. In some embodiments, the semiconductor device 100 includes a substrate 102, a device structure 104, a word line well 112, a source line 114, various spacers 116, a word line 118, a gate oxide layer 120, and a gap oxide layer 122. The substrate 102 may be a semiconductor substrate. The substrate 102 may be composed of a single-crystalline semiconductor material or a compound semiconductor material. For example, silicon or germanium may be used as a material forming the substrate 102. In certain examples, the substrate 102 may be a silicon on insulator (SOI) substrate.

In some examples, the device structure 104 includes a trap storage structure 106, a control gate 108, and a cap structure 110. The trap storage structure 106 is disposed on the substrate 102. The trap storage structure 106 includes an oxide layer 124, a nitride layer 126, and an oxide layer 128. The oxide layer 124, the nitride layer 126, and the oxide layer 128 stacked on the substrate 102 in sequence to form an ONO structure. The oxide layer 124 and the oxide layer 128 may be formed from silicon oxide, and the nitride layer 126 may be formed from silicon nitride. In some exemplary examples, the oxide layer 124 has a thickness ranging from about 10 angstroms to about 20 angstroms, the nitride layer 126 has a thickness ranging from about 100 angstroms to about 150 angstroms, and the oxide layer 128 has a thickness ranging from about 30 angstroms to about 50 angstroms.

As shown in FIG. 1, the control gate 108 is directly stacked on the oxide layer 128 of the trap storage structure 106. In some exemplary examples, the control gate 108 is formed from polysilicon. The cap structure 110 is disposed on the control gate 108. The cap structure 110 is stacked on the control gate 108, such that the cap structure 110 and the control gate 108 form a stacked structure 130. In some exemplary examples, the cap structure 110 includes a nitride layer 132 and an oxide layer 134. The nitride layer 132 is stacked on the control gate 108, and the oxide layer 134 is stacked on the nitride layer 132. In some exemplary examples, the nitride layer 132 is formed from silicon nitride, and the oxide layer 134 is formed from silicon oxide.

Referring to FIG. 1, the word line well 112 and the source line 114 are disposed in the substrate 102, in which the word line well 112 and the source line 114 are located at opposite sides of the stacked structure 130 respectively. The word line well 112 and the source line 114 may be implanted regions. In some exemplary examples, the word line well 112 and the source line 114 include dopants, such as boron and phosphorous.

The spacers 116 are respectively disposed on sidewalls of the stacked structure 130. In some examples, the spacers 116 are located on the second oxide layer 128 of the trap storage structure 106. In some exemplary examples, each of the spacers 116 includes an oxide layer 136, a nitride layer 138, and an oxide layer 140. The oxide layer 136, the nitride layer 138, and the oxide layer 140 stacked on the sidewall of the stacked structure 130 in sequence to form an ONO structure. The oxide layer 136 and the oxide layer 140 may be formed from silicon oxide, and the nitride layer 138 may be formed from silicon nitride.

As shown in FIG. 1, the gap oxide layer 122 is disposed on a sidewall of one of the spacers 116. The gap oxide layer 122 may be located on the substrate 102 and may cover a sidewall of the trap storage structure 106 adjacent to the sidewall of the one of the spacers 116. In some exemplary examples, the gap oxide layer 122 is formed from silicon oxide.

The word line 118 is disposed on the word line well 112 and the gap oxide layer 122. As shown in FIG. 1, the gap oxide layer 122 is located between the one of the spacers 116 and the word line 118 and between the trap storage structure 106 and the word line 118, so as to isolate the word line 118 from the control gate 108 and the trap storage structure 106. The word line 118 may be formed from polysilicon. The gate oxide layer 120 is disposed on the word line well 112 in the substrate 102 and under the word line 118. The gate oxide layer 120 may be formed from silicon oxide.

The trap storage structure 106 is an ONO structure, such that the trap storage structure 106 is thinner than a conventional polysilicon floating gate, and the control gate 108 can be directly stacked on the trap storage structure 106. Thus, the device structure 104 has a lower structure topology which is close to that of other devices, such that the subsequent patterning processes of the semiconductor device 100 are relatively easy, thereby simplifying a process for manufacturing the semiconductor device and integration of the processes of the semiconductor device 100 and the other devices, and decreasing process time and reducing process cost.

In addition, by using the ONO structure as the trap storage structure 106, the semiconductor device 100 can be programmed using a source side injection (SSI) programming method, and can be erased using a Fowler-Nordheim (FN) erase method, thereby decreasing power consumption of the semiconductor device 100. Furthermore, because the semiconductor device 100 can be programmed by a SSI programming method, the programming operation of the semiconductor device 100 can be performed by a byte mode.

In some examples, the semiconductor device 100 may include another device structure 142, another word line well 144, another spacers 146, another word line 148, another dielectric layer 150, and another gap oxide layer 152. The device structure 142 includes a trap storage structure 154, a control gate 156, and a cap structure 158. The trap storage structure 154 is disposed on the substrate 102, and is located at a side of the source line 114 opposite to the trap storage structure 106. The trap storage structure 154 may include an oxide layer 160, a nitride layer 162, and an oxide layer 164. The oxide layer 160, the nitride layer 162, and the oxide layer 164 stacked on the substrate 102 in sequence to form an ONO structure. The oxide layer 160 and the oxide layer 164 may be formed from silicon oxide, and the nitride layer 162 may be formed from silicon nitride. In some exemplary examples, the oxide layer 160 has a thickness ranging from about 10 angstroms to about 20 angstroms, the nitride layer 162 has a thickness ranging from about 100 angstroms to about 150 angstroms, and the oxide layer 164 has a thickness ranging from about 30 angstroms to about 50 angstroms.

As shown in FIG. 1, the control gate 156 is directly stacked on the oxide layer 164 of the trap storage structure 154. In some exemplary examples, the control gate 156 is formed from polysilicon. The cap structure 158 is disposed on the control gate 156. The cap structure 158 is stacked on the control gate 156 and the trap storage structure 154, such that the cap structure 158 and the control gate 156 form a stacked structure 166. In some exemplary examples, the cap structure 158 includes a nitride layer 168 and an oxide layer 170. The nitride layer 168 is stacked on the control gate 156, and the oxide layer 170 is stacked on the nitride layer 168. In some exemplary examples, the nitride layer 168 is formed from silicon nitride, and the oxide layer 170 is formed from silicon oxide.

As shown in FIG. 1, the word line well 144 is disposed in the substrate 102, and the word line well 144 is located at a side of the stacked structure 166 opposite to the source line 114. The word line well 144 may be an implanted region. In some exemplary examples, the word line well 144 includes dopants, such as boron and phosphorous.

The spacers 146 are respectively disposed on sidewalls of the stacked structure 166. In some examples, the spacers 146 are located on the second oxide layer 164 of the trap storage structure 154. In some exemplary examples, each of the spacers 146 includes an oxide layer 172, a nitride layer 174, and an oxide layer 176. The oxide layer 172, the nitride layer 174, and the oxide layer 176 stacked on the sidewall of the stacked structure 166 in sequence to form an ONO structure. The oxide layer 172 and the oxide layer 176 may be formed from silicon oxide, and the nitride layer 174 may be formed from silicon nitride.

Referring to FIG. 1, the gap oxide layer 152 is disposed on a sidewall of one of the spacers 146. The gap oxide layer 152 may be located on the substrate 102 and may cover a sidewall of the trap storage structure 154 adjacent to the sidewall of the one of the spacers 146. In some exemplary examples, the gap oxide layer 152 is formed from silicon oxide.

The word line 148 is disposed on the word line well 144 and the gap oxide layer 152. As shown in FIG. 1, the gap oxide layer 152 is located between the one of the spacers 146 and the word line 148 and between the trap storage structure 154 and the word line 148, so as to isolate the word line 148 from the control gate 156 and the trap storage structure 154. The word line 148 may be formed from polysilicon. The dielectric layer 150 is disposed on the word line well 144 in the substrate 102 and under the word line 148. The dielectric layer 150 may be formed from silicon oxide.

In some examples, as shown in FIG. 1, the semiconductor device 100 may further include a logic device 178, shallow trench isolation structures 180 and 184, and a high voltage device 182. In some exemplary examples, the semiconductor device 100 may further include a logic well 186 and a high voltage well 188, in which the logic well 186 and the high voltage well 188 are disposed in the substrate 102. The logic device 178 is disposed on the logic well 186 in the substrate 102 at the side of the word line well 112 opposite to the stacked structure 130. The logic device 178 may include a gate dielectric layer 190 and a gate 192, in which the gate dielectric layer 190 is disposed on the logic well 186, and the gate 192 is stacked on the gate dielectric layer 190. The gate dielectric layer 190 may be formed from silicon oxide, and the gate 192 may be formed from polysilicon. In the illustrated embodiment in FIG. 1, the shallow trench isolation structure 180 is disposed between the logic device 178 and the word line well 112. The shallow trench isolation structure 180 may be formed from silicon oxide.

In the illustrated embodiment in FIG. 1, the high voltage device 182 is disposed on the high voltage well 188 in the substrate 102 at the side of the word line well 144 opposite to the stacked structure 166. The high voltage device 182 may include a gate dielectric layer 194 and a gate 196, in which the gate dielectric layer 194 is disposed on the high voltage well 188, and the gate 196 is stacked on the gate dielectric layer 194. The gate dielectric layer 194 may be formed from silicon oxide, and the gate 196 may be formed from polysilicon. The shallow trench isolation structure 184 is disposed between the high voltage device 182 and the word line well 144. The shallow trench isolation structure 184 may be formed from silicon oxide.

As shown in FIG. 1, the semiconductor device 100 may further include lightly doped drains 112a, 144a, 186a, 186b, 188a, and 188b. The lightly doped drain 112a is disposed in the word line well 112, the lightly doped drain 144a is disposed in the word line well 144, the lightly doped drains 186a and 186b are disposed in the logic well 186 at opposite sides of the gate 192 respectively, and the lightly doped drains 188a and 188b are disposed in the high voltage well 188 at opposite sides of the gate 196 respectively.

Figure 2A:
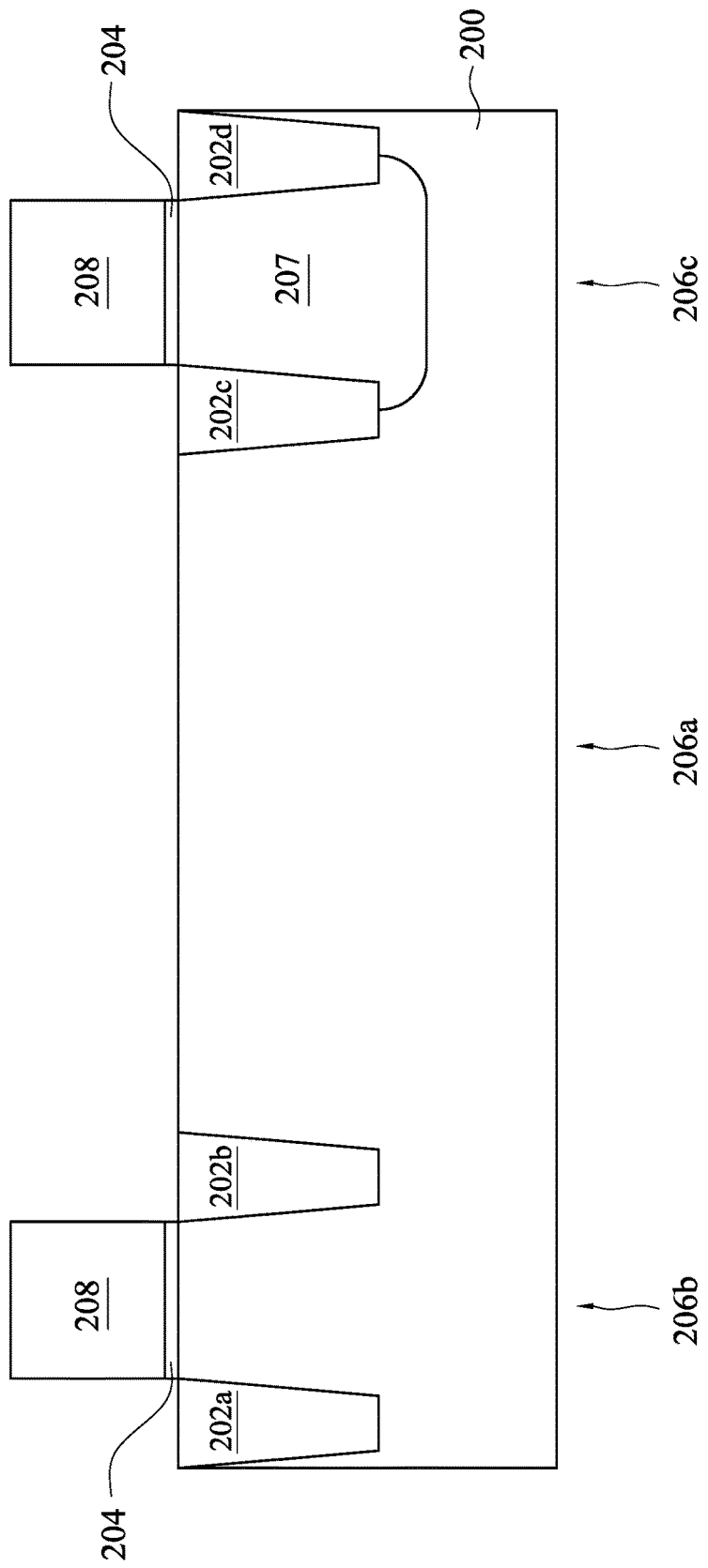
FIG. 2A through FIG. 2K are schematic cross-sectional views of intermediate stages showing a method for manufacturing a semiconductor device in accordance with various embodiments.

Referring to FIG. 2A through FIG. 2K, FIG. 2A through FIG. 2K are schematic cross-sectional views of intermediate stages showing a method for manufacturing a semiconductor device in accordance with various embodiments. As shown in FIG. 2A, a substrate 200 is provided. The substrate 200 may be a semiconductor substrate. The substrate 200 may be composed of a single-crystalline semiconductor material or a compound semiconductor material. For example, silicon or germanium may be used as a material forming the substrate 200. In certain examples, the substrate 200 may be a silicon on insulator substrate.

Referring to FIG. 2A again, various isolation structures 202a, 202b, 202c, and 202d are formed in the substrate 200. In some examples, in the formation of the isolation structures 202a, 202b, 202c, and 202d, a pad oxide layer 204 is formed to cover the substrate 200, a hard mask (not shown) is formed to cover the pad oxide layer 204, portions of the pad oxide layer 204 and the hard mask are patterned by an OD lithography and followed by the dry etch, and following is the underlying portions of the substrate 200 are removed to form various trenches in the substrate 200 and the pad oxide layer 204, an isolation material is formed to fill the trenches and to cover the hard mask layer. After a chemical mechanical polish (CMP) process (not show here), the isolation material is polished and the hard mask is exposed and then the hard mask are removed to form the isolation structures 202a, 202b, 202c, and 202d in the substrate 200. The isolation structures 202a, 202b, 202c, and 202d formed in the substrate 200 at least define a first region 206a, a second region 206b, and a third region 206c, in which the first region 206a is located between the isolation structures 202b and 202c, the second region 206b is located between the isolation structures 202a and 202b, the third region 206c is located between the isolation structures 202c and 202d. The isolation structures 202a, 202b, 202c, and 202d may be shallow trench isolation (STI) structures. The isolation material may be formed by using a high density plasma chemical vapor deposition (HDP CVD) method.

In some examples, after the isolation structures 202a, 202b, 202c, and 202d are completed, a high voltage well 207 is formed in the third region 206c by using an implantation method. The high voltage well 207 includes an n-type well and a p-type well. Then, a portion of the pad oxide layer 204, which is located on the first region 206a, is removed using a patterned mask layer 208 as an etching mask, as shown in FIG. 2A. The patterned mask layer 208 may be formed from a photoresist material. After the portion of the pad oxide layer 204 is removed, the patterned mask layer 208 is removed.

Figure 2B:
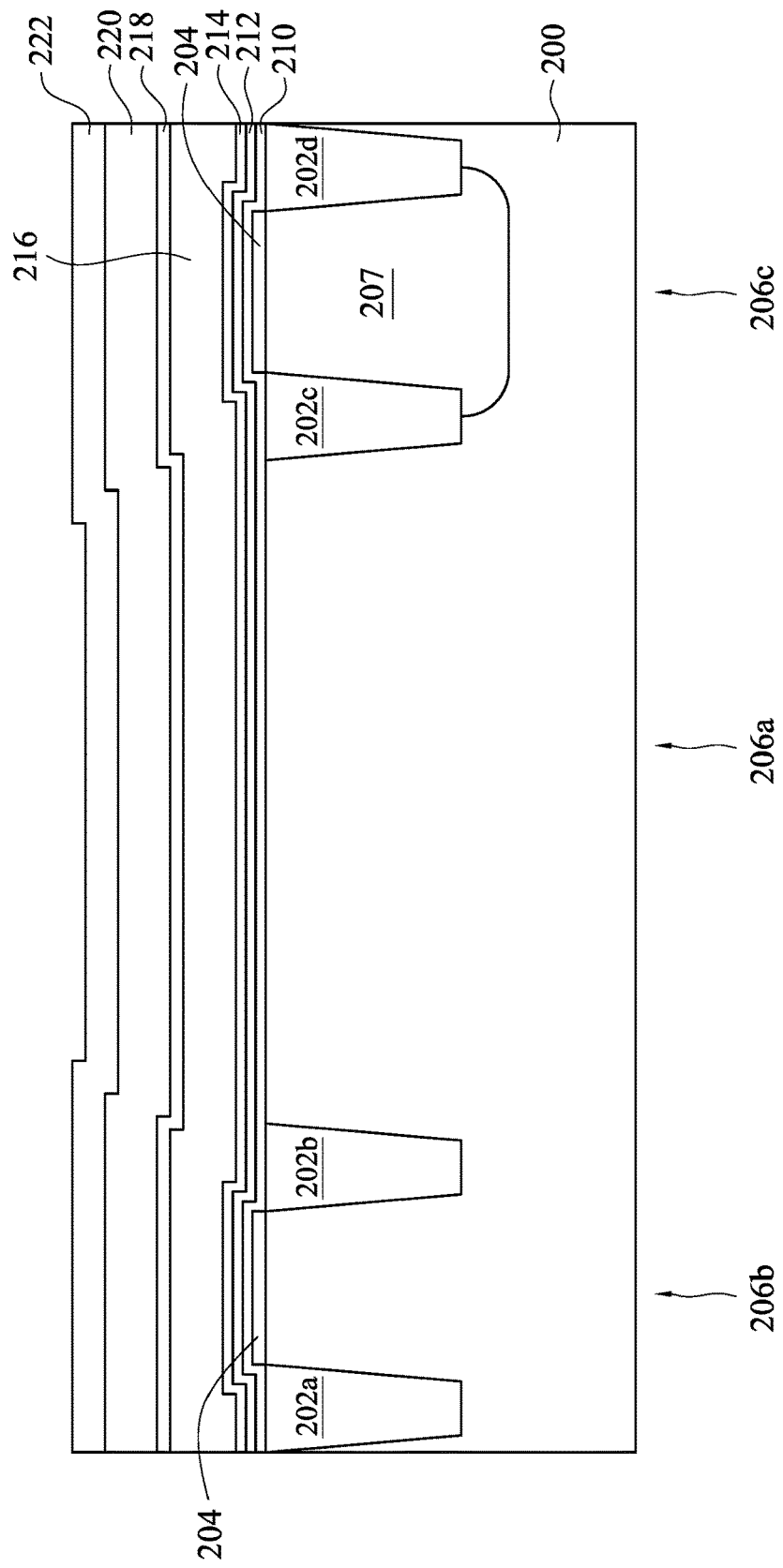

As shown in FIG. 2B, an oxide layer 210, a nitride layer 212, and an oxide layer 214 are formed to cover the substrate 200 in sequence to form an ONO structure. The oxide layer 210, the nitride layer 212, and the oxide layer 214 may be formed by using a deposition method or a growth method, such as a chemical vapor deposition (CVD) method. The oxide layers 210 and 214 may be formed from silicon oxide, and the nitride layer 212 may be formed from silicon nitride. The oxide layer 210 is formed to have a thickness ranging from about 10 angstrom to about 20 angstrom, the nitride layer 212 is formed to have a thickness ranging from about 100 angstrom to about 150 angstrom, and the oxide layer 214 is formed to have a thickness ranging from about 30 angstrom to about 50 angstrom. A control gate layer 216 is formed to cover the oxide layer 214 by using a deposition method, such as a chemical vapor deposition method. The control gate layer 216 may be formed from polysilicon. In some exemplary examples, the control gate layer 216 is directly deposed on the oxide layer 214.

Referring to FIG. 2B again, a nitride layer 218, an oxide layer 220, and a nitride layer 222 are formed to cover the control gate layer 216 in sequence to form an NON structure. The nitride layer 218, the oxide layer 220, and the nitride layer 222 may be formed by using a deposition method, such as a chemical vapor deposition method. The nitride layers 218 and 222 may be formed from silicon nitride, and the oxide layer 220 may be formed from silicon oxide.

Figure 2C:
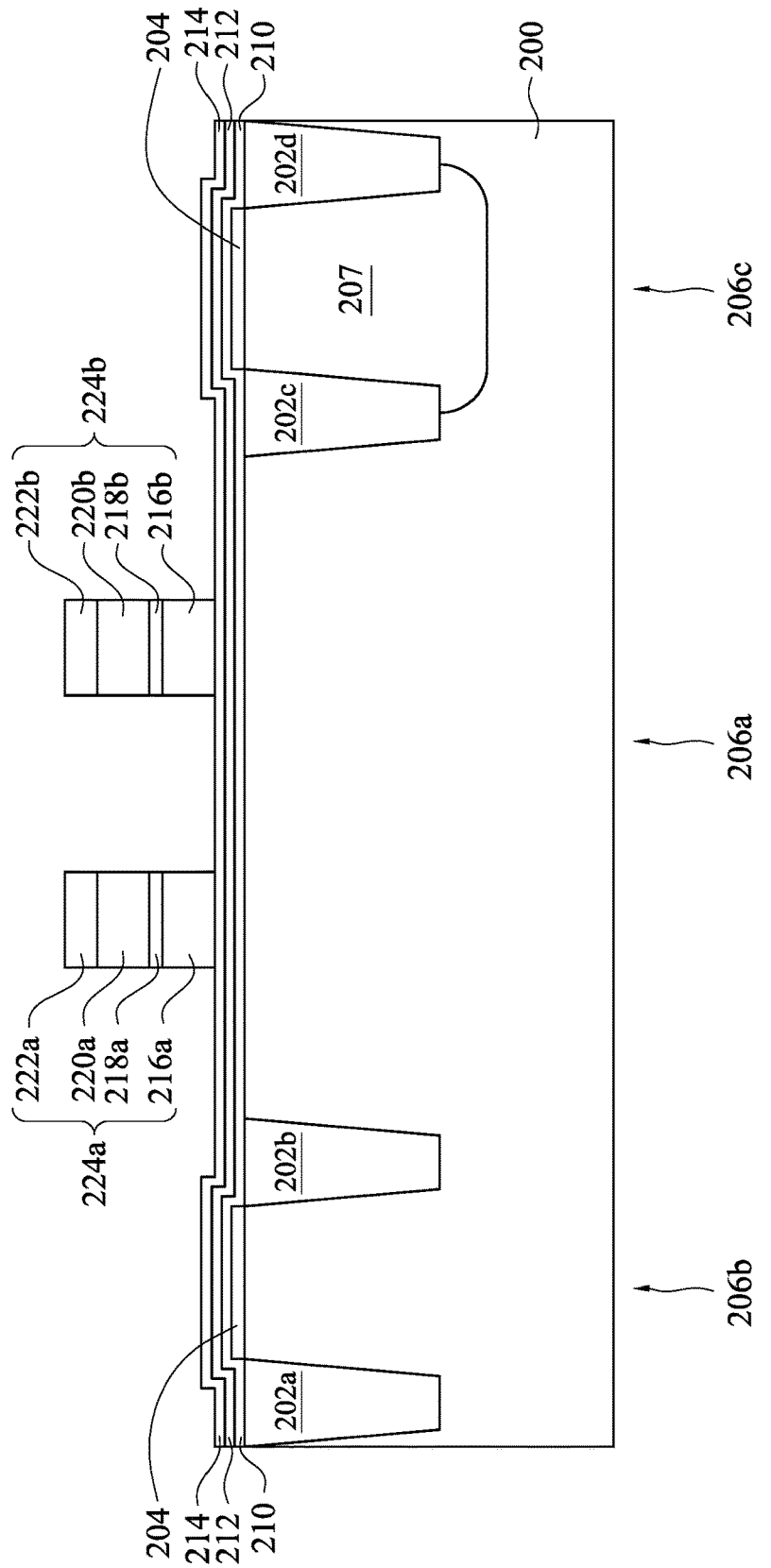

As shown in FIG. 2C, a portion of the nitride layer 222, a portion of the oxide layer 220, a portion of the nitride layer 218, and a portion of the control gate layer 216 are removed by using a photolithography method and an etching method. The remaining portions of the control gate layer 216 are disposed on the first region 206a, and the remaining portions of the control gate layer 216 form a control gate 216a and a control gate 216b respectively. The remaining portion 218a of the nitride layer 218, the remaining portion 220a of the oxide layer 220, and the remaining portion 222a of the nitride layer 222 are stacked on the control gate 216a to form a stacked structure 224a with the control gate 216a. The remaining portion 218b of the nitride layer 218, the remaining portion 220b of the oxide layer 220, and the remaining portion 222b of the nitride layer 222 are stacked on the control gate 216b to form a stacked structure 224b with the control gate 216b.

Figure 2D:
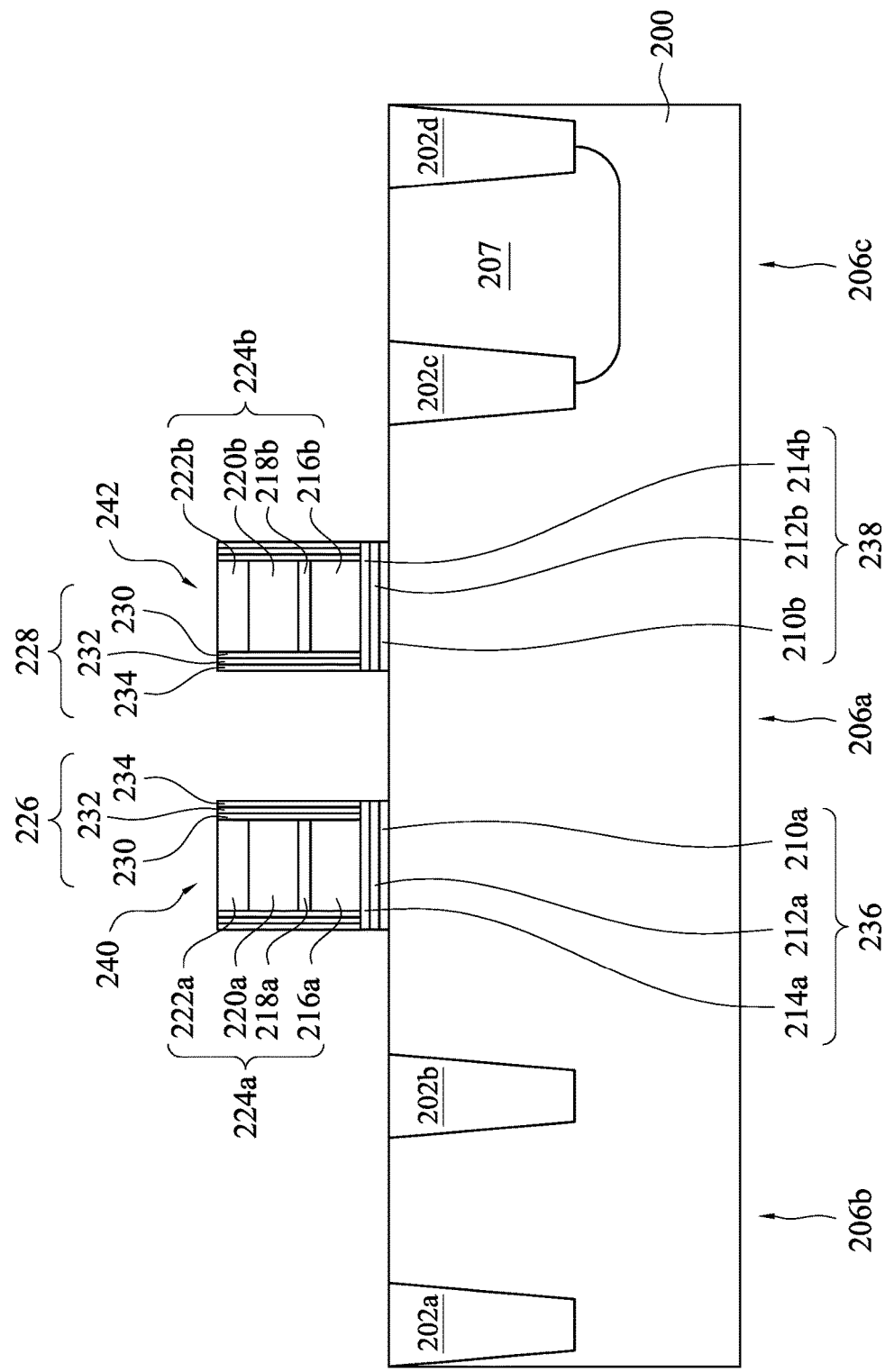

As shown in FIG. 2D, spacers 226 and 228 are respectively formed on sidewalls of the stacked structures 224a and 224b to complete device structures 240 and 242, in which the device structures 240 and 242 are located on the first region 206a, and the device structure 240 is separated from the device structure 242. In some examples, each of the spacers 226 and 228 is formed to include an oxide layer 230, a nitride layer 232, and an oxide layer 234 stacked on the sidewall of the stacked structure 224a or 224b in sequence. In some exemplary examples, forming the spacers 226 and 228 includes blanketly forming the oxide layer 230, the nitride layer 232, and the oxide layer 234 in sequence to cover the stacked structures 224a and 224b and the oxide layer 214, and etching the oxide layer 230, the nitride layer 232, and the oxide layer 234 to remove a portion of the oxide layer 230, a portion of the nitride layer 232, and a portion of the oxide layer 234, so as to form the spacers 226 on the sidewalls of the stacked structure 224a and the spacers 228 on the sidewalls of the stacked structure 224b. The oxide layer 230, the nitride layer 232, and the oxide layer 234 may be formed by a deposition method, such as a chemical vapor deposition method. Etching the oxide layer 230, the nitride layer 232, and the oxide layer 234 may be performed by using an anisotropic etching method. As shown in FIG. 2D, etching the oxide layer 230, the nitride layer 232, and the oxide layer 234 includes etching the oxide layer 214, the nitride layer 212, the oxide layer 210, and the pad oxide layer 204. The remaining portion 210a of the oxide layer 210, the remaining portion 212a of the nitride layer 212, and the remaining portion 214a of the oxide layer 214 stacked in sequence form a trap storage structure 236, and the remaining portion 210b of the oxide layer 210, the remaining portion 212b of the nitride layer 212, and the remaining portion 214b of the oxide layer 214 stacked in sequence form a trap storage structure 238.

Figure 2E:
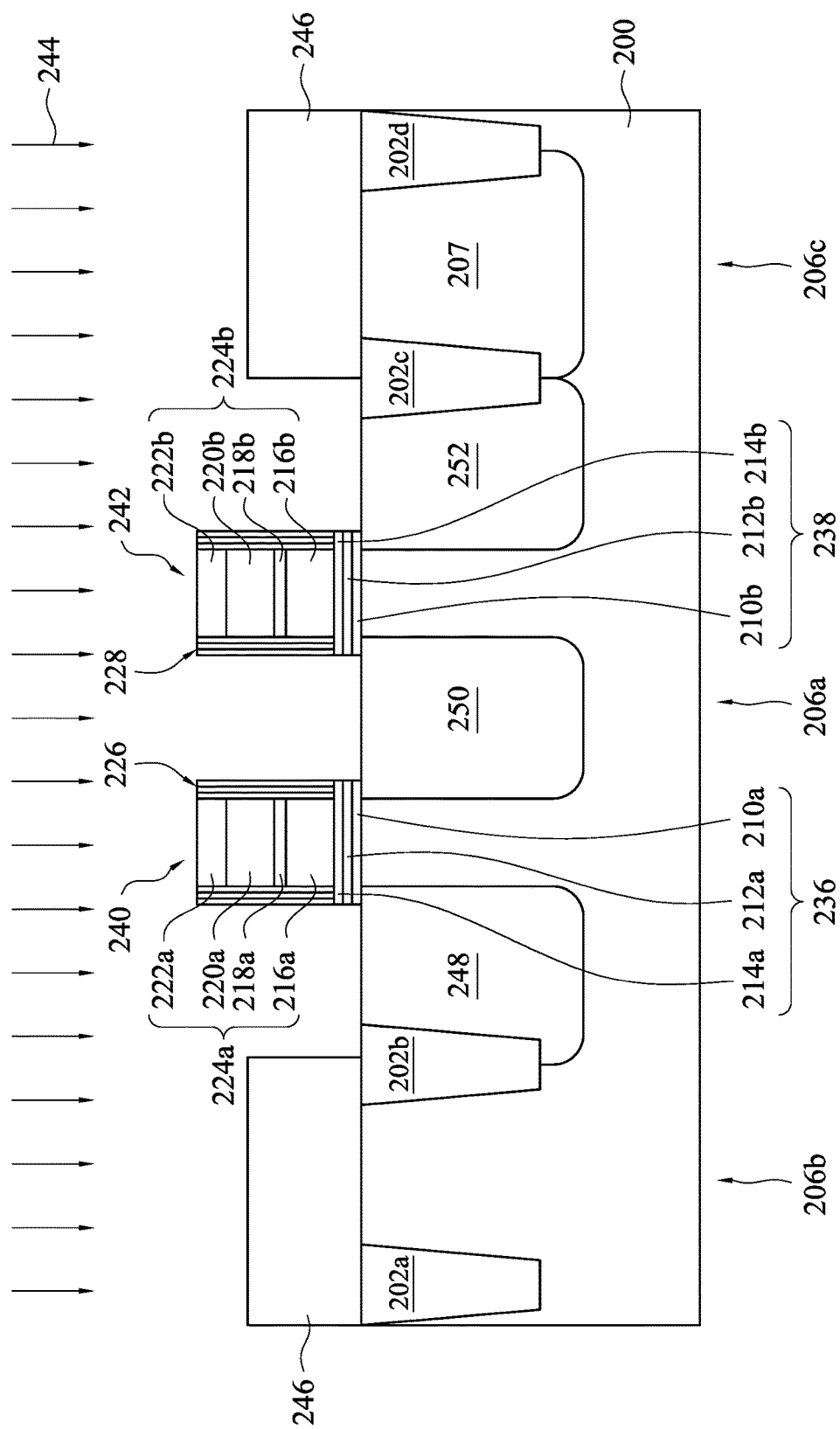

In some examples, as shown in FIG. 2E, after the device structures 240 and 242 are completed, an implantation process 244 may be performed with a mask layer 246 covering the second region 206b and the third region 206c, so as to form a word line well 248, a well 250, and a word line well 252 in the first region 206a. The word line wells 248 and 252 are respectively adjacent to the device structures 240 and 242, and the well 250 is located between the device structure 240 and 242, and the well 250 is opposite to the word line wells 248 and 252 respectively. The implantation process 244 may be performed using dopants, such as boron and phosphorous. The mask layer 246 may be formed from a photoresist material, and the mask layer 246 may be formed by using a spin-coating process and a photolithography process.

Figure 2F:
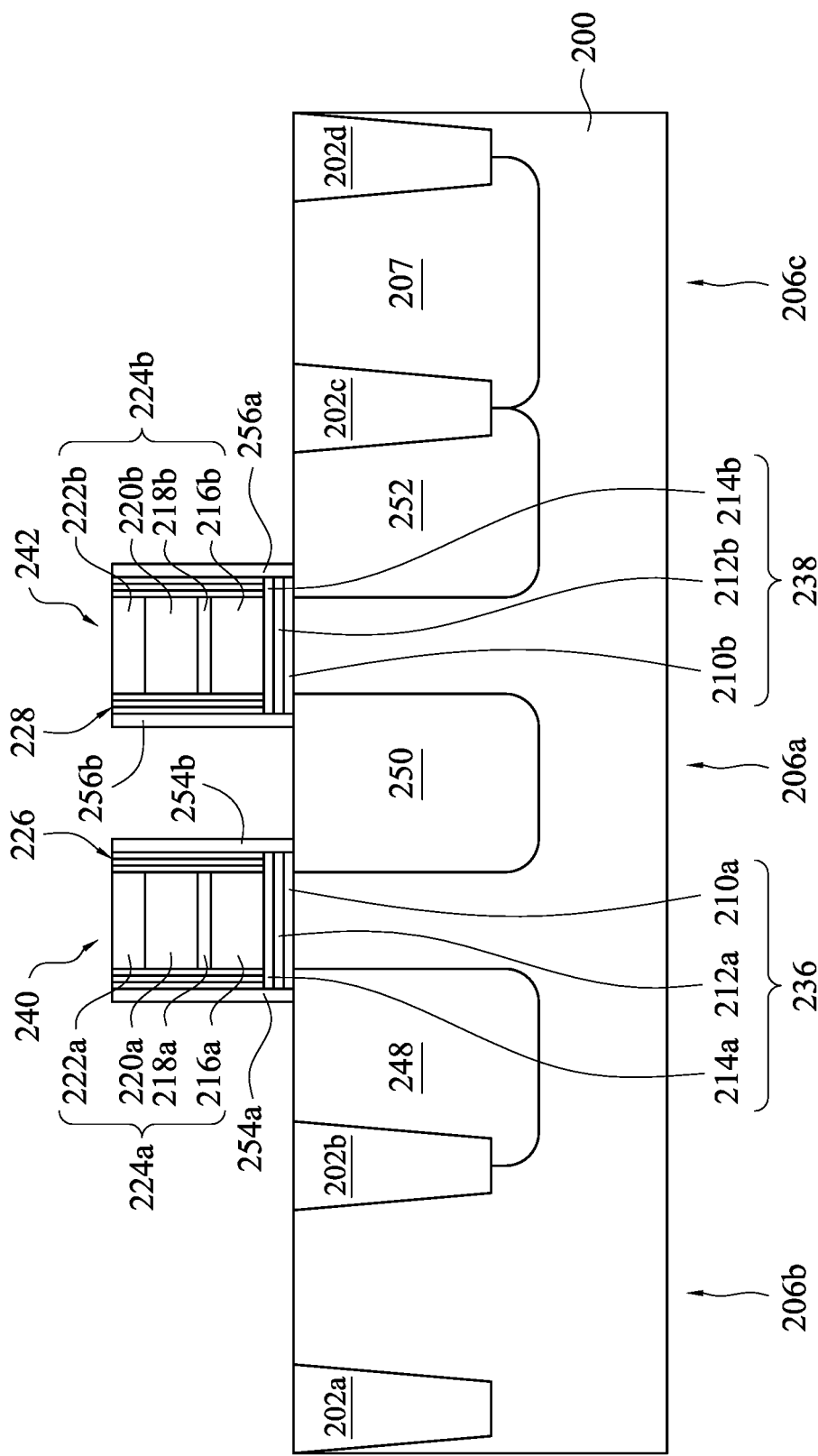

In some examples, as shown in FIG. 2F, gap oxide layers 254a and 254b are formed on sidewalls of the spacers 226 respectively, and gap oxide layers 256a and 256b are formed on sidewalls of the spacers 228 respectively. The gap oxide layer 254b and 256b are disposed on the well 250. In some exemplary examples, forming the gap oxide layers 254a, 254b, 256a, and 256b includes forming an oxide layer to cover the device structures 240 and 244 and the substrate 200, and etching the oxide layer to remove a portion of the oxide layer to form the gap oxide layers 254a, 254b, 256a, and 256b. The oxide layer may be formed from silicon oxide, and the oxide layer may be formed by a high temperature oxide (HTO) method. Etching the oxide layer may be performed by an anisotropic etching method. Optionally, in the formation of the gap oxide layers 254a, 254b, 256a, and 256b, a rapid thermal annealing (RTA) process may be performed on the oxide layer between forming the oxide layer and etching the oxide layer.

Figure 2G:
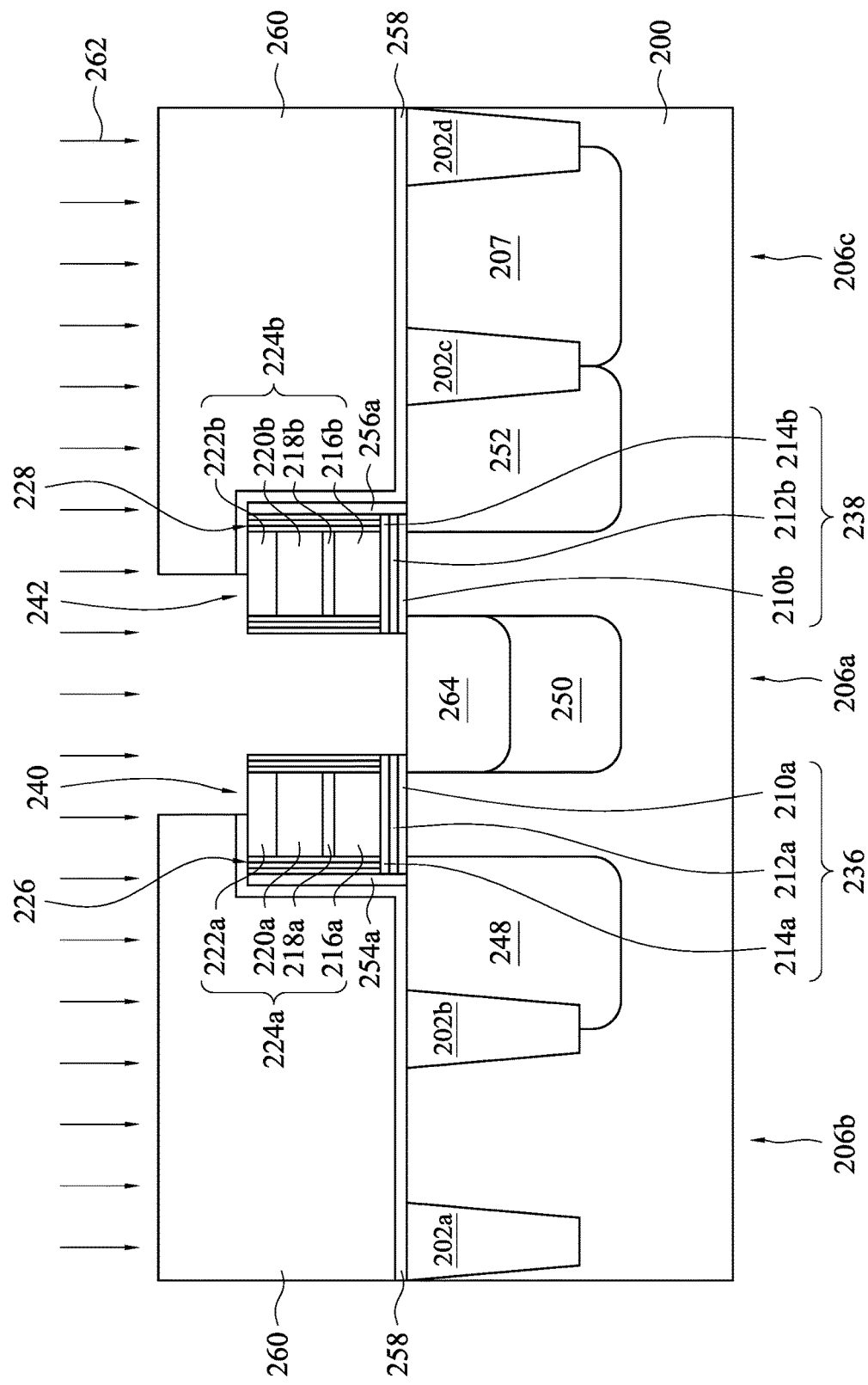

In some examples, as shown in FIG. 2G, a gate oxide layer 258 may be formed to cover the device structures 240 and 242, the gap oxide layers 254a, 254b, 256a, and 256b, and the substrate 200. In some exemplary examples, the gate oxide layer 258 may be formed to include a rapid thermal oxide (RTO) layer and a high temperature oxide layer on the rapid thermal oxide layer. A rapid thermal annealing process may be optionally performed on the gate oxide layer 258. Then, a patterned mask layer 260 is formed on a portion of the gate oxide layer 258. A portion of the gate oxide layer 258 over the well 250 and adjacent to the well 250 is exposed. An implantation process 262 is performed to form a source line 264 in the well 250. After the source line 264 is completed, the exposed portion of the gate oxide layer 258, and the gap oxide layers 254b and 256b are removed by an etching method. The patterned mask layer 260 is removed.

Figure 2H:
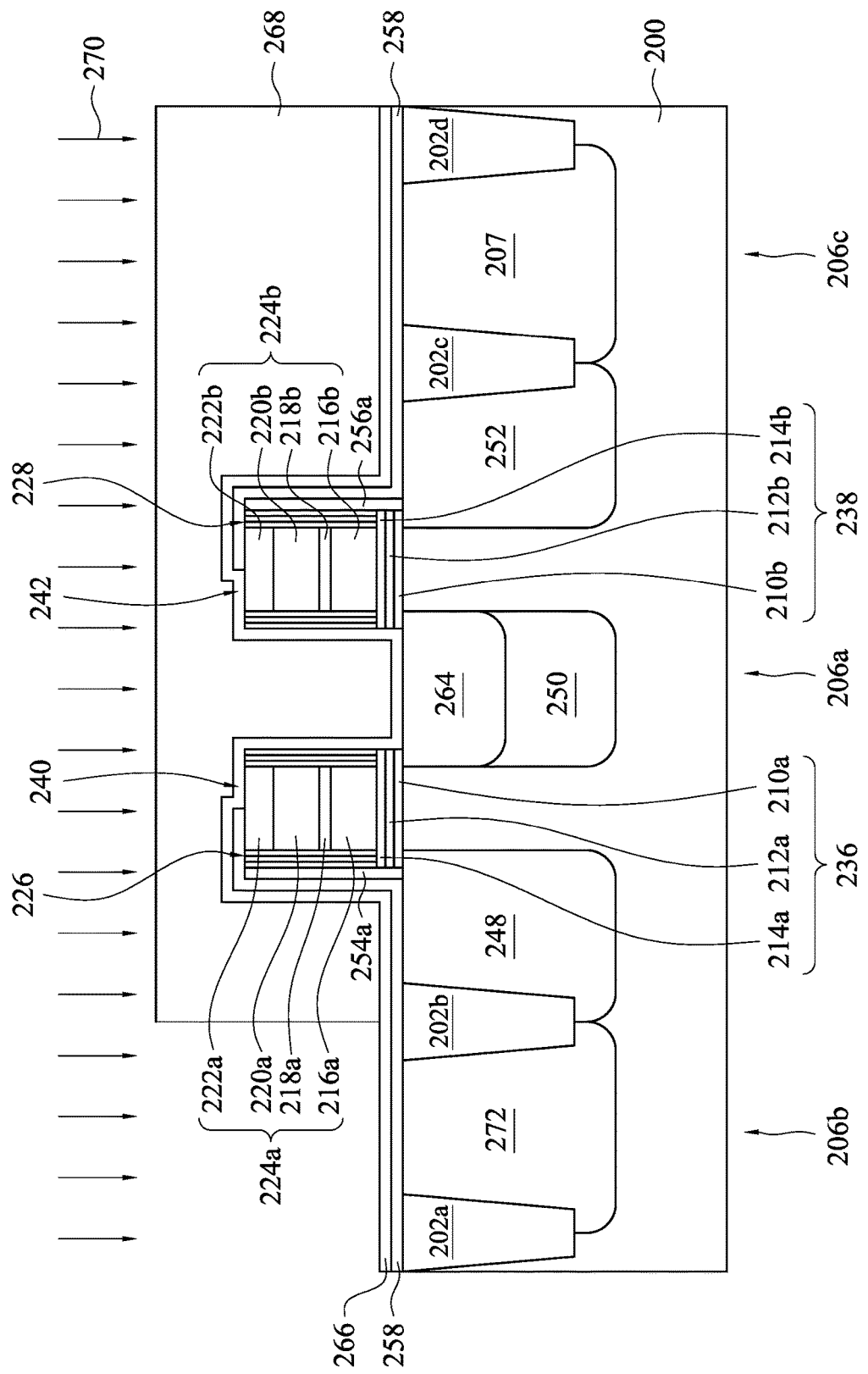

In some examples, as shown in FIG. 2H, a gate oxide layer 266 may be formed to cover the device structures 240 and 242, the gate oxide layer 258, and the substrate 200. In some exemplary examples, the gate oxide layer 266 may be formed to include a rapid thermal oxide layer and a high temperature oxide layer on the rapid thermal oxide layer. A rapid thermal annealing process may be optionally performed on the gate oxide layer 266. Then, a patterned mask layer 268 is formed on a portion of the gate oxide layer 266. A portion of the gate oxide layer 266 in the second region 206b is exposed. An implantation process 270 is performed to form a logic well 272 in the substrate 200 in the second region 206b. After the logic well 272 is completed, the patterned mask layer 268 is removed.

Figure 2I:
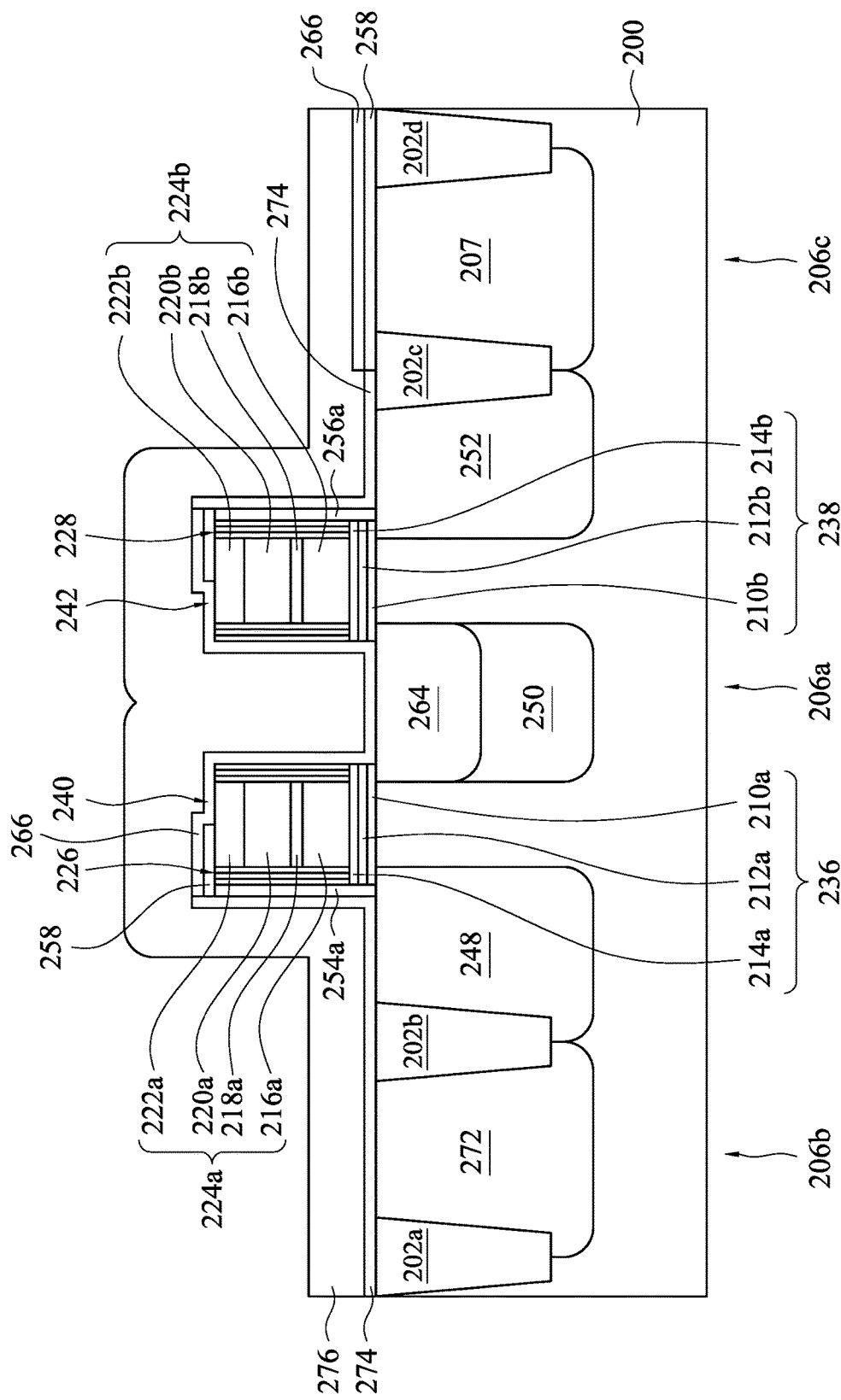

In some examples, as shown in FIG. 2I, the gate oxide layers 258 and 266 in the second region 206b and portions of the first region 206a adjacent to the second region 206b and the third region 206c are removed by an etching method. Then, a gate oxide layer 274 is formed on the substrate 200 in the second region 206b and the portions of the first region 206a. The gate oxide layer 274 may be formed to include an IO gate oxide layer and a core oxide layer. The gate oxide layer 274 may be formed from silicon oxide and may be formed by using a thermal oxidation method. Then, a conductive layer 276 is formed to cover the gate oxide layer 266 and the gate oxide layer 274. In some exemplary examples, the conductive layer 276 may be formed from polysilicon, and may be formed by using a deposition method, such as a chemical vapor deposition method.

Figure 2J:
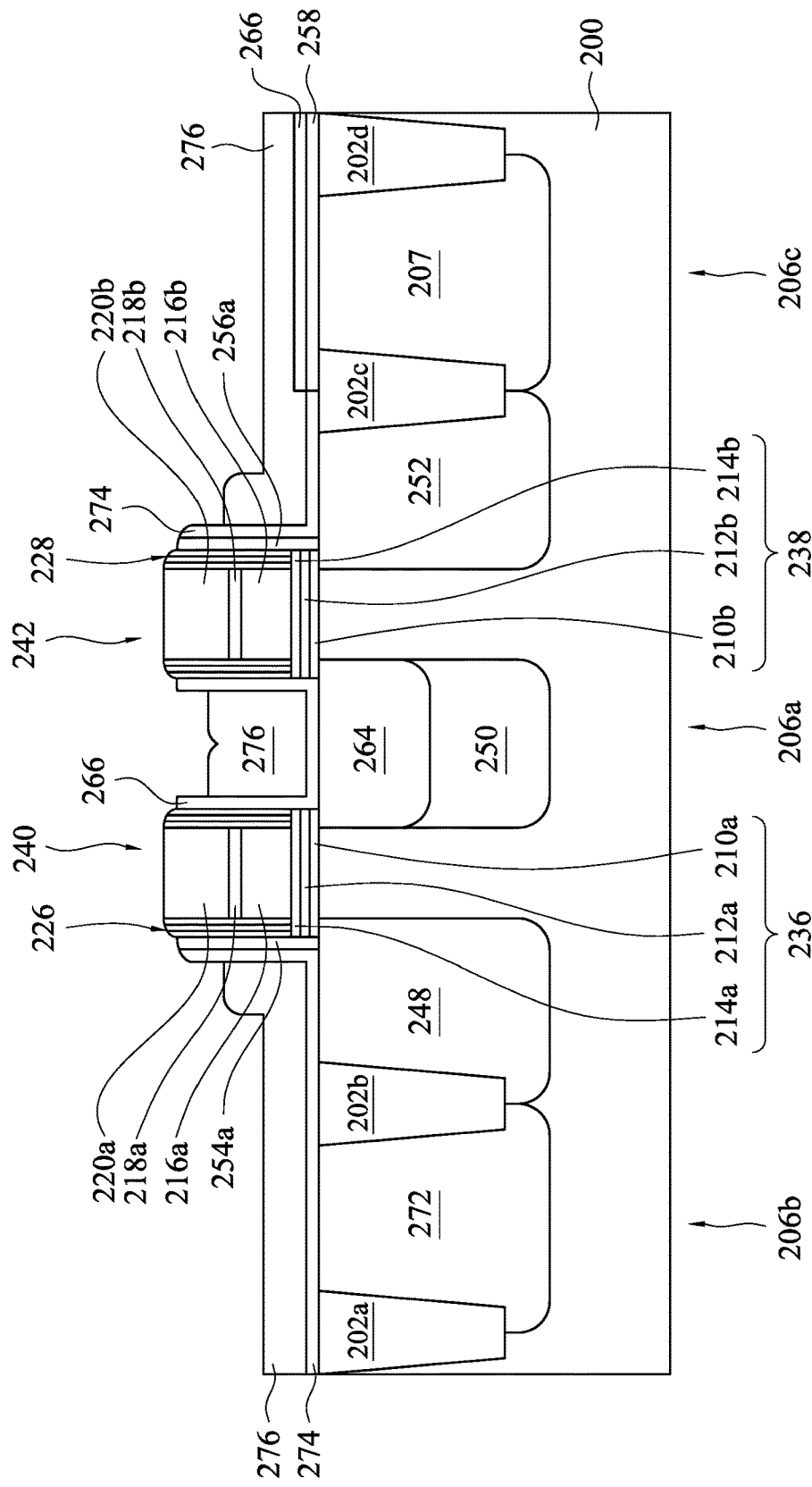

As shown in FIG. 2J, a portion of the conductive layer 276 over the device structures 240 and 242, the spacers 226 and 228, the gap oxide layers 254a and 256a, and the gate oxide layers 258 and 266 on the device structures 240 and 242 and the spacers 226 and 228 is removed by using a photolithography method and an etching method. In the removing of the portion of the conductive layer 276, the nitride layers 222a and 222b, portions of the oxide layers 220a and 220b, portions of the spacers 226 and 228, and portions of the gate oxide layers 258 and 266 on the device structures 240 and 242 are removed.

Figure 2K:
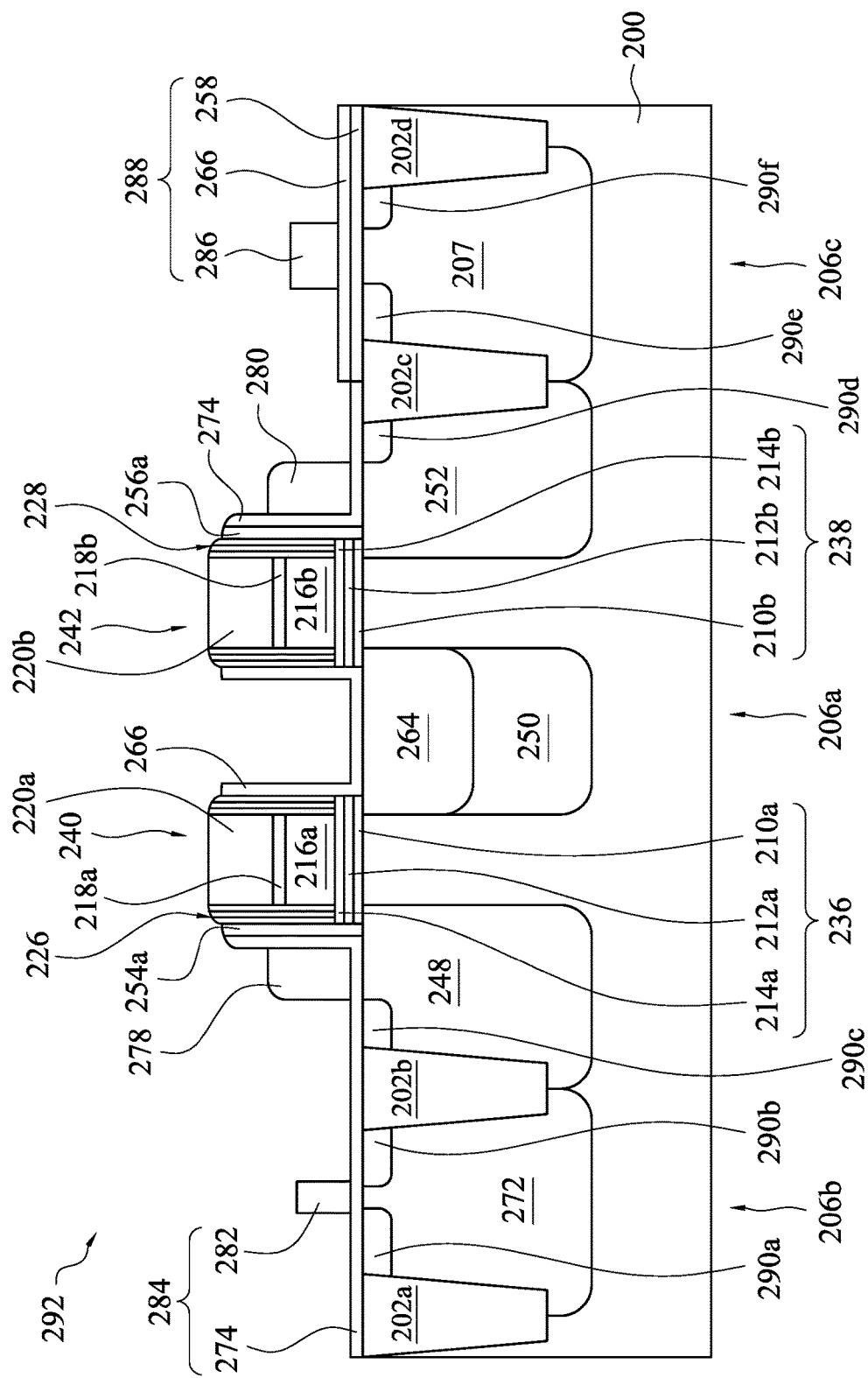

As shown in FIG. 2K, the conductive layer 276 is further etched to form word lines 278 and 280. In some examples, the word line 278 is disposed on the gate oxide layer 274 over the word line well 248 and on one of the spacers 226 of the device structure 240, in which the gap oxide layer 254a is located between the word line 278 and the spacer 226; and the word line 280 is disposed on the gate oxide layer 274 over the word line well 252 and on one of the spacers 228 of the device structure 242, in which the gap oxide layer 256a is located between the word line 280 and the spacer 228. In some exemplary examples, forming of the word lines 278 and 280 further include forming a gate 282 of a logic device 284 on the second region 206b and a gate 286 of a high voltage device 288 on the third region 206c. The logic device 284 mainly includes the gate 282 and the gate dielectric layer 274, and the high voltage device 288 mainly includes the gate 286 and the gate oxide layers 266 and 258.

Referring to FIG. 2K again, in some examples, after the word lines 278 and 280, the gates 282 and 286 are formed, various lightly doped drains 290a-290f are formed in the substrate 200 by using an implantation method, and followed by N+ or P+S/D IMP, and a silicide formation process, so as to complete a semiconductor device 292. The lightly doped drains 290a and 290b are formed in the logic well 272 at opposite sides of the gate 282 and adjacent to the gate 282, the lightly doped drain 290c is formed in the word line well 248 adjacent the word line 278, the lightly doped drain 290d is formed in the word line well 252 adjacent the word line 280, and the lightly doped drains 290e and 290f are formed in the high voltage well 207 at opposite sides of the gate 286 and adjacent to the gate 286.

Figure 3:
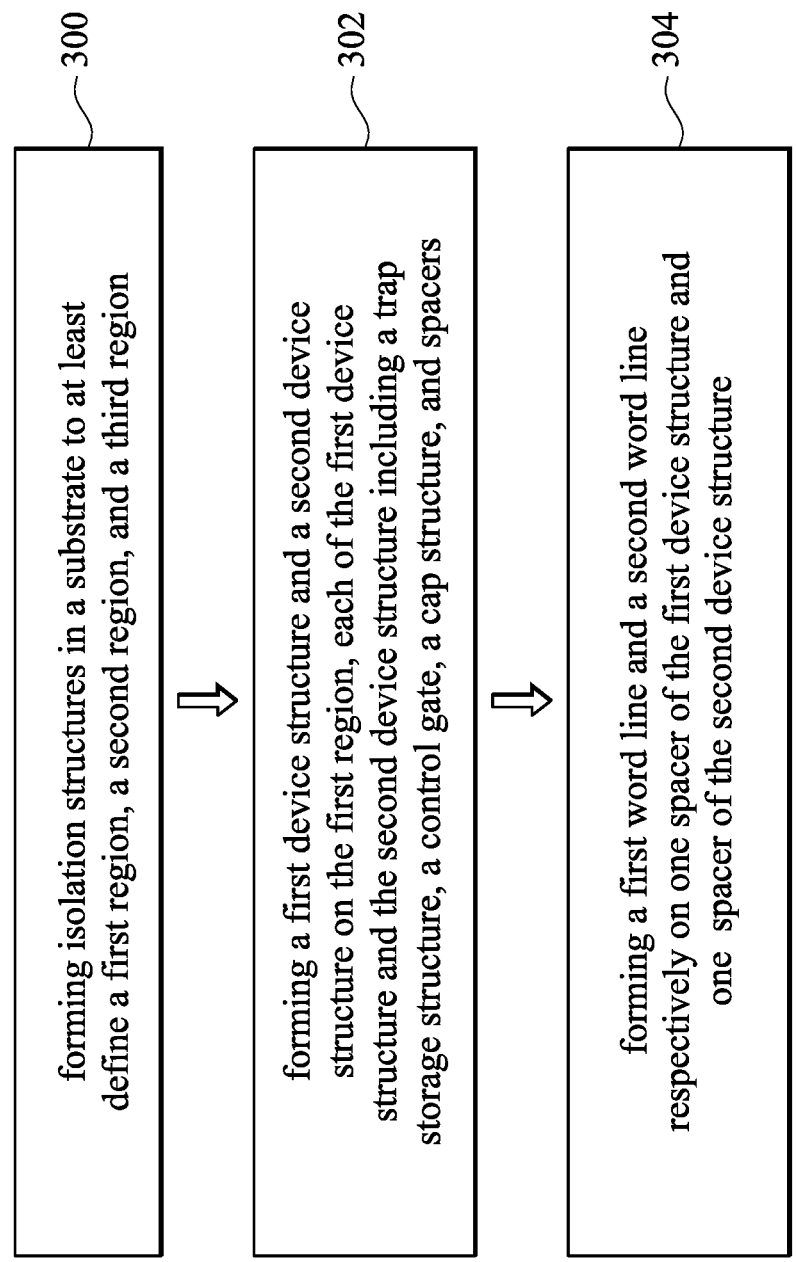
FIG. 3 is a flow chart of a method for manufacturing a semiconductor device in accordance with various embodiments.

Referring to FIG. 3 with FIG. 2A through FIG. 2K, FIG. 3 is a flow chart of a method for manufacturing a semiconductor device in accordance with various embodiments. The method begins at operation 300, where a substrate 200 is provided. The substrate 200 may be a semiconductor substrate, such as a crystalline semiconductor substrate or a compound semiconductor substrate. For example, silicon or germanium may be used as a material forming the substrate 200. In certain examples, the substrate 200 may be a silicon on insulator substrate.

Then, as shown in FIG. 2A, various isolation structures 202a, 202b, 202c, and 202d are formed in the substrate 200 to at least define a first region 206a, a second region 206b, and a third region 206c, in which the first region 206a is located between the isolation structures 202b and 202c, the second region 206b is located between the isolation structures 202a and 202b, the third region 206c is located between the isolation structures 202c and 202d. In some examples, in the formation of the isolation structures 202a, 202b, 202c, and 202d, a pad oxide layer 204 is formed to cover the substrate 200, a hard mask (not shown) is formed to cover the pad oxide layer 204, portions of the pad oxide layer 204 and the hard mask are patterned by an OD lithography and followed by the dry etch, and following is the underlying portions of the substrate 200 are removed to form various trenches in the substrate 200 and the pad oxide layer 204, an isolation material is formed to fill the trenches and to cover the hard mask layer. After a CMP process (not show here), the isolation material is polished and the hard mask is exposed and then the hard mask are removed to form the isolation structures 202a, 202b, 202c, and 202d in the substrate 200. The isolation structures 202a, 202b, 202c, and 202d may be shallow trench isolation (STI) structures and may be formed by using a high density plasma chemical vapor deposition method.

In some examples, a high voltage well 207 is formed in the third region 206c by using an implantation method. The high voltage well 207 includes an n-type well and a p-type well. Then, a portion of the pad oxide layer 204, which is located on the first region 206a, is removed using a patterned mask layer 208 as an etching mask, as shown in FIG. 2A. Then, the patterned mask layer 208 is removed. The patterned mask layer 208 may be formed from a photoresist material.

At operation 302, device structures 240 and 242 are formed on the first region 206a, as shown in FIG. 2D. In some examples, in the forming of the device structures 240 and 242, an oxide layer 210, a nitride layer 212, and an oxide layer 214 are formed to cover the substrate 200 in sequence to form an ONO structure. The oxide layer 210, the nitride layer 212, and the oxide layer 214 may be formed by using a deposition method or a growth method. The oxide layer 210 is formed to have a thickness ranging from about 10 angstrom to about 20 angstrom, the nitride layer 212 is formed to have a thickness ranging from about 100 angstrom to about 150 angstrom, and the oxide layer 214 is formed to have a thickness ranging from about 30 angstrom to about 50 angstrom. A control gate layer 216 is formed to cover the oxide layer 214 by using a deposition method. In some exemplary examples, the control gate layer 216 is directly deposed on the oxide layer 214. Then, a nitride layer 218, an oxide layer 220, and a nitride layer 222 are formed to cover the control gate layer 216 in sequence to form an NON structure. The nitride layer 218, the oxide layer 220, and the nitride layer 222 may be formed by using a deposition method.

As shown in FIG. 2C, a portion of the nitride layer 222, a portion of the oxide layer 220, a portion of the nitride layer 218, and a portion of the control gate layer 216 are removed by using a photolithography method and an etching method. The remaining portions of the control gate layer 216 are disposed on the first region 206a, and form a control gate 216a and a control gate 216b respectively. The remaining portion 218a of the nitride layer 218, the remaining portion 220a of the oxide layer 220, and the remaining portion 222a of the nitride layer 222 are stacked on the control gate 216a to form a stacked structure 224a with the control gate 216a. The remaining portion 218b of the nitride layer 218, the remaining portion 220b of the oxide layer 220, and the remaining portion 222b of the nitride layer 222 are stacked on the control gate 216b to form a stacked structure 224b with the control gate 216b.

As shown in FIG. 2D, spacers 226 and 228 are respectively formed on sidewalls of the stacked structures 224a and 224b to complete the device structures 240 and 242, which are separated from each other. In some examples, each of the spacers 226 and 228 is formed to include an oxide layer 230, a nitride layer 232, and an oxide layer 234 stacked on the sidewall of the stacked structure 224a or 224b in sequence. In some exemplary examples, forming the spacers 226 and 228 includes forming the oxide layer 230, the nitride layer 232, and the oxide layer 234 in sequence to cover the stacked structures 224a and 226a and the oxide layer 214, and etching the oxide layer 230, the nitride layer 232, and the oxide layer 234 to remove a portion of the oxide layer 230, a portion of the nitride layer 232, and a portion of the oxide layer 234, so as to form the spacers 226 on the sidewalls of the stacked structure 224a and the spacers 228 on the sidewalls of the stacked structure 224b. The oxide layer 230, the nitride layer 232, and the oxide layer 234 may be formed by a deposition method. Etching the oxide layer 230, the nitride layer 232, and the oxide layer 234 may be performed by using an anisotropic etching method. As shown in FIG. 2D, etching the oxide layer 230, the nitride layer 232, and the oxide layer 234 includes etching the oxide layer 214, the nitride layer 212, the oxide layer 210, and the pad oxide layer 204. The remaining portion 210*a* of the oxide layer 210, the remaining portion 212*a* of the nitride layer 212, and the remaining portion 214*a* of the oxide layer 214 stacked in sequence form a trap storage structure 236, and the remaining portion 210*b* of the oxide layer 210, the remaining portion 212*b* of the nitride layer 212, and the remaining portion 214*b* of the oxide layer 214 stacked in sequence form a trap storage structure 238.

In some examples, as shown in FIG. 2E, after the device structures 240 and 242 are completed, an implantation process 244 may be performed with a mask layer 246 covering the second region 206*b* and the third region 206*c*, so as to form a word line well 248, a well 250, and a word line well 252 in the first region 206*a*. The word line wells 248 and 252 are respectively adjacent to the device structures 240 and 242, and the well 250 is located between the device structure 240 and 242, and the well 250 is opposite to the word line wells 248 and 252 respectively. The mask layer 246 may be formed from a photoresist material, and the mask layer 246 may be formed by using a spin-coating process and a photolithography process.

In some examples, as shown in FIG. 2F, gap oxide layers 254*a* and 254*b* are formed on sidewalls of the spacers 226 respectively, and gap oxide layers 256*a* and 256*b* are formed on sidewalls of the spacers 228 respectively. The gap oxide layer 254*b* and 256*b* are disposed on the well 250. In some exemplary examples, forming the gap oxide layers 254*a*, 254*b*, 256*a*, and 256*b* includes forming an oxide layer to cover the device structures 240 and 244 and the substrate 200, and etching the oxide layer to remove a portion of the oxide layer to form the gap oxide layers 254*a*, 254*b*, 256*a*, and 256*b*. The oxide layer may be formed by a high temperature oxide (HTO) method. Etching the oxide layer may be performed by an anisotropic etching method. A rapid thermal annealing process may be optionally performed on the oxide layer between forming the oxide layer and etching the oxide layer.

In some examples, as shown in FIG. 2G, a gate oxide layer 258 may be formed to cover the device structures 240 and 242, the gap oxide layers 254*a*, 254*b*, 256*a*, and 256*b*, and the substrate 200. A rapid thermal annealing process may be optionally performed on the gate oxide layer 258. Then, a patterned mask layer 260 is formed on a portion of the gate oxide layer 258. A portion of the gate oxide layer 258 over the well 250 and adjacent to the well 250 is exposed. An implantation process 262 is performed to form a source line 264 in the well 250. After the source line 264 is completed, the exposed portion of the gate oxide layer 258, and the gap oxide layers 254*b* and 256*b* are removed by an etching method. Then, the patterned mask layer 260 is removed.

In some examples, as shown in FIG. 2H, a gate oxide layer 266 may be formed to cover the device structures 240 and 242, the gate oxide layer 258, and the substrate 200. A rapid thermal annealing process may be optionally performed on the gate oxide layer 266. Then, a patterned mask layer 268 is formed on a portion of the gate oxide layer 266. A portion of the gate oxide layer 266 in the second region 206*b* is exposed. An implantation process 270 is performed to form a logic well 272 in the substrate 200 in the second region 206*b*. After the logic well 272 is completed, the patterned mask layer 268 is removed.

In some examples, as shown in FIG. 2I, the gate oxide layers 258 and 266 in the second region 206*b* and portions of the first region 206*a* adjacent to the second region 206*b* and the third region 206*c* are removed by an etching method. Then, a gate oxide layer 274 is formed on the substrate 200 in the second region 206*b* and the portions of the first region 206*a*. The gate oxide layer 274 may be formed to include an IO gate oxide layer and a core oxide layer. The gate oxide layer 274 may be formed by using a thermal oxidation method.

At operation 304, word lines 278 and 280 are respectively formed on one of the spacers 226 of the device structure 240 and one of the spacers 228 of the device structure 242, as shown in FIG. 2K. In some examples, as shown in FIG. 2I, in the formation of the word lines 278 and 280, a conductive layer 276 is formed to cover the gate oxide layer 266 and the gate oxide layer 274 by using a deposition method. As shown in FIG. 2J, a portion of the conductive layer 276 over the device structures 240 and 242, the spacers 226 and 228, the gap oxide layers 254*a* and 256*a*, and the gate oxide layers 258 and 266 on the device structures 240 and 242 and the spacers 226 and 228 is removed by using a photolithography method and an etching method. In the removing of the portion of the conductive layer 276, the nitride layers 222*a* and 222*b*, portions of the oxide layers 220*a* and 220*b*, portions of the spacers 226 and 228, and portions of the gate oxide layers 258 and 266 on the device structures 240 and 242 are removed.

As shown in FIG. 2K, the conductive layer 276 is further etched to form the word lines 278 and 280. In some examples, the word line 278 is disposed on the gate oxide layer 274 over the word line well 248 and on one of the spacers 226 of the device structure 240, in which the gap oxide layer 254*a* is located between the word line 278 and the spacer 226. The word line 280 is disposed on the gate oxide layer 274 over the word line well 252 and on one of the spacers 228 of the device structure 242, in which the gap oxide layer 256*a* is located between the word line 280 and the spacer 228. In some exemplary examples, forming of the word lines 278 and 280 further include forming a gate 282 of a logic device 284 on the second region 206*b* and a gate 286 of a high voltage device 288 on the third region 206*c*, in which the logic device 284 may include the gate 282 and the gate dielectric layer 274, and the high voltage device 288 may include the gate 286 and the gate oxide layers 266 and 258.

In some examples, various lightly doped drains 290*a*-290*f* may be optionally formed in the substrate 200 by using an implantation method, and followed by N+ or P+S/D IMP, and a silicide formation process, so as to complete a semiconductor device 292. The lightly doped drains 290*a* and 290*b* are formed in the logic well 272 at opposite sides of the gate 282 and adjacent to the gate 282, the lightly doped drain 290*c* is formed in the word line well 248 adjacent the word line 278, the lightly doped drain 290*d* is formed in the word line well 252 adjacent the word line 280, and the lightly doped drains 290*e* and 290*f* are formed in the high voltage well 207 at opposite sides of the gate 286 and adjacent to the gate 286.

In accordance with an embodiment, the present disclosure discloses a semiconductor device. The semiconductor device includes a substrate, a first trap storage structure, a first control gate, a first cap structure, a first word line well, a source line, first spacers, a first gap oxide layer, a first word line, and a first dielectric layer. The first trap storage structure includes a first oxide layer, a first nitride layer and a second oxide layer stacked on the substrate in sequence. The first control gate is directly stacked on the first trap storage structure. The first cap structure is stacked on the first control gate to form a first stacked structure. The first word line well and the source line are disposed in the substrate at opposite sides of the first stacked structure respectively. The first spacers are disposed on sidewalls of the first stacked structure. The first gap oxide layer is disposed on a sidewall of one of the first spacers. The first word line is disposed on the first word line well and the first gap oxide layer. The first dielectric layer is disposed between the first word line and the first word line well.

In accordance with another embodiment, the present disclosure discloses a method for manufacturing a semiconductor device. In this method, isolation structures are formed in a substrate to at least define a first region, a second region, and the third region. A first device structure and a second device structure separated from the first device structure are formed on the first region. Forming each of the first device structure and the second device structure further includes forming a trap storage structure including a first oxide layer, a first nitride layer and a second oxide layer stacked on the substrate in sequence, forming a control gate directly on the trap storage structure, forming a cap structure on the control gate to form a stacked structure, and forming spacers respectively on sidewalls of the stacked structure. A first word line and a second word line are respectively formed on one of the spacers of the first device structure and one of the spacers of the second device structure.

In accordance with yet another embodiment, the present disclosure discloses a method for manufacturing a semiconductor device. In this method, isolation structures are formed in a substrate to at least define a first region, a second region, and a third region. High voltage wells are formed in the third region. A first device structure and a second device structure separated from the first device structure are formed on the first region. Forming each of the first device structure and the second device structure further includes forming a trap storage structure including a first oxide layer, a first nitride layer and a second oxide layer stacked on the substrate in sequence, forming a control gate directly on the trap storage structure, forming a cap structure on the control gate to form a stacked structure, and forming spacers respectively on sidewalls of the stacked structure. A first word line well, a well, and a second word line well are formed in the first region. The first word line well and the second word line well are respectively adjacent to the first device structure and the second device structure, and the well is located between the first device structure and the second device structure and is opposite to the first word line well and the second word line well respectively. A first gap oxide layer and a second gap oxide layer are respectively formed on a sidewall of one of the spacers of the first device structure and a sidewall of one of the spacers of the second device structure. A source line is formed in the well. A logic well is formed in the second region. A first word line, a second word line, a gate of a high voltage device, and a gate of a logic device are respectively formed on the first word line well adjacent to the first gap oxide layer, the second word line well adjacent to the second gap oxide layer, the high voltage wells, and the logic well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a plurality of isolation structures in a substrate to at least define a first region, a second region, and a third region;
    forming a first device structure and a second device structure separated from the first device structure on the first region, forming each of the first device structure and the second device structure further comprising:
        forming a first oxide layer, a first nitride layer and a second oxide layer stacked on the substrate in sequence;
        forming a control gate directly on the second oxide layer;
        forming a cap structure on the control gate to form a stacked structure;
        forming a plurality of spacers respectively on a plurality of sidewalls of the stacked structure and on a top surface of the second oxide layer; and
        performing an etching operation on the first oxide layer, the first nitride layer, and the second oxide layer to remove first portions of the first oxide layer, the first nitride layer, and the second oxide layer that are free from coverage by the stacked structure and the spacers, wherein second portions of the first oxide layer, the first nitride layer, and the second oxide layer remain under the stacked structure and the spacers after the etching operation to form a trap storage structure, and a bottom surface of each of the spacers is formed to entirely contact the second oxide layer; and
    forming a first word line and a second word line respectively on one of the spacers of the first device structure and one of the spacers of the second device structure.

2. The method of claim 1, after forming the spacers, the method further comprising:
    forming a first word line well, a well, and a second word line well in the first region, wherein the first word line well and the second word line well are respectively adjacent to the first device structure and the second device structure, and the well is located between the first device structure and the second device structure, and is opposite to the first word line well and the second word line well respectively.

3. The method of claim 2, after forming the first word line well, the well, and the second word line well, the method further comprising:
    forming a first gap oxide layer and a second gap oxide layer, wherein the first gap oxide layer and the second gap oxide layer are respectively between the first word line and the one of the spacers of the first device structure and between the second word line and the one of the spacers of the second device structure.

4. The method of claim 3, during forming the first gap oxide layer and the second gap oxide layer, the method further comprising forming a source line in the well.

5. The method of claim 4, before forming the first device structure and the second device structure, the method further comprising forming a high voltage well in the third region.

6. The method of claim 5, after forming the source line, the method further comprising forming a logic well in the second region.

7. The method of claim 6, wherein forming the first word line and the second word line comprises forming a gate of a high voltage device on the third region and a gate of a logic device on the second region.

8. The method of claim 7, after forming the first word line, the second word line, the gate of the high voltage device, and the gate of the logic device, the method further comprising:
forming a plurality of lightly doped drains in the first word line well adjacent the first word line, the second word line well adjacent to the second word line, the high voltage well adjacent to the gate of the high voltage device, and the logic well adjacent to the gate of the logic device.

9. The method of claim 1, wherein the first oxide layer has a thickness ranging substantially from 10 angstrom to 20 angstrom, the first nitride layer has a thickness ranging substantially from 100 angstrom to 150 angstrom, and the second oxide layer has a thickness ranging substantially from 30 angstrom to 50 angstrom.

10. The method of claim 1, wherein each of the spacers is formed to comprise a third oxide layer, a second nitride layer, and a fourth oxide layer stacked on the stacked structure in sequence.

11. A method for manufacturing a semiconductor device, the method comprising:
forming a plurality of isolation structures in a substrate to at least define a first region, a second region, and a third region;
forming a high voltage well in the third region;
forming a first device structure and a second device structure separated from the first device structure on the first region, forming each of the first device structure and the second device structure further comprising:
forming a trap storage structure comprising a first oxide layer, a first nitride layer and a second oxide layer stacked on the substrate in sequence;
forming a control gate directly on the trap storage structure;
forming a cap structure on the control gate to form a stacked structure; and
forming a plurality of spacers respectively on a plurality of sidewalls of the stacked structure, wherein a bottom surface of each of the spacers and a bottom surface of the control gate are formed to entirely contact a same top surface of the second oxide layer;
forming a first word line well, a well, and a second word line well in the first region, wherein the first word line well and the second word line well are respectively adjacent to the first device structure and the second device structure, and the well is located between the first device structure and the second device structure and is opposite to the first word line well and the second word line well respectively;
forming a first gap oxide layer and a second gap oxide layer respectively on a sidewall of one of the spacers of the first device structure and a sidewall of one of the spacers of the second device structure, wherein forming the first gap oxide layer is performed such that the first gap oxide layer is between the first and second device structures and in contact with a sidewall of the trap storage structure;
removing the first gap oxide layer;
forming a source line in the well;
forming a logic well in the second region; and
forming a first word line on the first word line well adjacent to the first gap oxide layer, a second word line on the second word line well adjacent to the second gap oxide layer, a gate of a high voltage device on the high voltage well, and a gate of a logic device on the logic well.

12. The method of claim 11, wherein each of the spacers is formed to comprise a third oxide layer, a second nitride layer, and a fourth oxide layer stacked on the stacked structure in sequence.

13. The method of claim 11, wherein after forming the first word line, the second word line, the gate of the high voltage device, and the gate of the logic device, the method further comprising:
forming a plurality of lightly doped drains in the first word line well adjacent the first word line, the second word line well adjacent to the second word line, the high voltage well adjacent to the gate of the high voltage device, and the logic well adjacent to the gate of the logic device.

14. The method of claim 11, wherein forming the trap storage structure is performed such that a bottom surface of the first oxide layer of the trap storage structure directly contacts the substrate.

15. A method for manufacturing a semiconductor device, the method comprising:
forming a first device structure on a substrate, forming the first device structure further comprising:
forming a first trap storage structure comprising a first oxide layer, a first nitride layer and a second oxide layer stacked on the substrate in sequence;
forming a first control gate directly on the first trap storage structure;
forming a first cap structure on the first control gate to form a first stacked structure; and
forming a plurality of first spacers respectively on a plurality of sidewalls of the first stacked structure, wherein a bottom surface of each of the first spacers is formed to entirely contact the second oxide layer;
forming a first word line well and a source line in the substrate at opposite sides of the first stacked structure respectively;
forming a first gate oxide layer simultaneously on the first word line well and a sidewall of one of the first spacers;
forming a first word line on the first gate oxide layer on the first word line well and the sidewall of the one of the first spacers; and
forming a second gate oxide layer in contact with the source line, the first oxide layer, the first nitride layer, and the second oxide layer.

16. The method of claim 15, wherein each of the first spacers is formed to comprise a third oxide layer, a second nitride layer, and a fourth oxide layer stacked on the first stacked structure in sequence.

17. The method of claim 15, wherein the first cap structure is formed to comprise a second nitride layer and a third oxide layer stacked on the first control gate in sequence.

18. The method of claim 15, after forming the first word line well and the source line, the method further comprising:
forming a first gap oxide layer on the sidewall of the one of the first spacers, wherein the first gap oxide layer is between the first gate oxide layer and the one of the first spacers.

19. The method of claim 15, during forming the first device structure, the method further comprising:
forming a second device structure separated from the first device structure on the substrate, wherein the source line is located between the first device structure and the second device structure, and forming the second device structure further comprises:

forming a second trap storage structure;
forming a second control gate directly on the second trap storage structure;
forming a second cap structure on the second control gate to form a second stacked structure; and
forming a plurality of second spacers respectively on a plurality of sidewalls of the second stacked structure and the second trap storage structure.

20. The method of claim 19, the method further comprising:
forming a second word line well in the substrate, wherein the second word line well and the source line are at opposite sides of the second stacked structure respectively;
forming a third gate oxide layer on the second word line well and a sidewall of one of the second spacers; and
forming a second word line on the third gate oxide layer on the second word line well and the sidewall of the one of the second spacers.

* * * * *